United States Patent
Wu et al.

(10) Patent No.: US 11,062,926 B2
(45) Date of Patent: Jul. 13, 2021

(54) WAFER CHARGES MONITORING

(71) Applicant: ADVANCED ION BEAM TECHNOLOGY, INC., Hsinchu (TW)

(72) Inventors: Chih-Chiang Wu, Tainan (TW); Chun-Chin Kang, Tainan (TW); Yu-Ho Ni, Tainan (TW); Chien-Ta Feng, Tainan (TW)

(73) Assignee: ADVANCED ION BEAM TECHNOLOGY, INC., Hsinchu (TW)

( * ) Notice: Subject to any disclaimer, the term of this patent is extended or adjusted under 35 U.S.C. 154(b) by 0 days.

(21) Appl. No.: 16/593,835

(22) Filed: Oct. 4, 2019

(65) Prior Publication Data

US 2020/0035526 A1    Jan. 30, 2020

Related U.S. Application Data

(62) Division of application No. 15/928,343, filed on Mar. 22, 2018, now Pat. No. 10,475,678.

(Continued)

(51) Int. Cl.
*H01L 21/67* (2006.01)
*H01L 21/265* (2006.01)
(Continued)

(52) U.S. Cl.
CPC ...... *H01L 21/67253* (2013.01); *H01L 21/265* (2013.01); *H01L 22/14* (2013.01); *H01L 22/20* (2013.01); *H01L 21/6831* (2013.01)

(58) Field of Classification Search
CPC .............................. H01L 21/265; H01L 22/14
See application file for complete search history.

(56) References Cited

U.S. PATENT DOCUMENTS 6,842,029 B2   1/2005   Howland
7,038,223 B2   5/2006   Starcher
(Continued)

FOREIGN PATENT DOCUMENTS

KR   10-1379218 B1   4/2014

OTHER PUBLICATIONS

Notice of Allowance received for U.S. Appl. No. 15/928,343, dated Jun. 18, 2019, 10 pages.
(Continued)

*Primary Examiner* — Dung A. Le
(74) *Attorney, Agent, or Firm* — Dentons US LLP

(57) ABSTRACT

Apparatus and method for monitoring wafer charges are proposed. A conductive pin, a conductive spring and a conductive line are configured in series to connect the backside surface of the wafer and the sample conductor so that the backside surface of the wafer and the surface of the sample conductor have identical charge density. Hence, by using a static electricity sensor positioned close to the surface of the sample conductor, the charges on the wafer may be monitored. Note that the charges appeared on the frontside surface of the wafer induces charges on the backside surface of the wafer. The sample conductor is a sheet conductor and properly insulated from the surrounding environment. As usual, the sample conductor and the static electricity sensor are positioned outside the chamber where the wafer is placed and processed, so as to simplify the apparatus inside the chamber and reduce the contamination risk.

14 Claims, 7 Drawing Sheets

Related U.S. Application Data

(60) Provisional application No. 62/503,514, filed on May 9, 2017.

(51) Int. Cl.
    *H01L 21/66*     (2006.01)
    *H01L 21/683*     (2006.01)

(56) References Cited

U.S. PATENT DOCUMENTS

| | | |
|---|---|---|
| 7,112,810 B2 | 9/2006 | Keum et al. |
| 7,675,730 B2 | 3/2010 | Walther et al. |
| 8,111,499 B2 | 2/2012 | Ni et al. |
| 2005/0096776 A1 | 5/2005 | Beaulieu et al. |
| 2008/0285202 A1* | 11/2008 | Boyd ............... H01L 21/67253 361/234 |
| 2014/0191749 A1 | 7/2014 | Bondar |
| 2015/0182165 A1 | 7/2015 | Miller et al. |
| 2015/0265215 A1 | 9/2015 | Dalke |
| 2015/0272459 A1 | 10/2015 | Dalke |
| 2016/0247009 A1* | 8/2016 | Lu ....................... G06K 9/00053 |

OTHER PUBLICATIONS

Office Action received for Taiwanese Patent Application No. 107108253, dated Jun. 12, 2020, 5 pages (Official Copy Only) (See Communication under 37 CFR § 1.98(a) (3)).

\* cited by examiner

WAFER CHARGES MONITORING

CROSS-REFERENCE TO RELATED APPLICATION

This application is a divisional of U.S. Ser. No. 15/928,343, entitled "WAFER CHARGES MONITORING," filed on Mar. 22, 2018, which claims priority from U.S. Provisional Ser. No. 62/503,514, entitled "WAFER CHARGES MONITORING," filed on May 9, 2017. The content of both applications are hereby incorporated by reference in their entirety for all purposes.

FIELD OF THE INVENTION

The present invention relates to wafer charges monitoring, especially to the apparatus and the method that may effectively monitor the charge density on the wafer surface during the operation period and/or outside the period of processing a wafer held by a chuck.

BACKGROUND OF THE INVENTION

Chuck is popularly used to hold the wafer to be processed. For example, in the plasma chamber used to perform the plasma process, such as CVD, PECVD and etching, the chuck is used to hold the wafer and apply electric voltage for attracting ions from the plasma to the wafer. For example, in the ion implanter, the wafer is held by the chuck and the ions are delivered to the wafer. However, in some instances an amount of charges may be accumulated on the processed wafer, especially on the frontside surface of the implanted wafer. Some popular causes of charge accumulation are listed as below: the ions may be not properly neutralized, even not neutralized, before the ions react with the wafer, the plasma or related reactive gas(es) may directly contact with both sides of the wafer, and the wafer may be not fully grounded through pins that connect the backside surface of the wafer to the ground due to improper installation, contamination, insulated layer on the backside surface and so on. No matter how the charges are accumulated and/or how the amount of the charges is varied, the existence of non-zero charges unavoidably induces some disadvantages. For example, the devices formed on and/or in the wafer may be damaged, and the wafer may be broken during the process of moving processed wafer away the chuck (such as electrostatic chuck) holding the wafer.

Some technologies have been proposed to monitor (or viewed as sense or detect) the charges on the wafer, for example, but not limited to, the following U.S. Pat. Nos. 7,038,223, 7,112,810, 7,675,730 and 8,111,499. In short, U.S. Pat. No. 7,112,810 disposes the charge sensor adjacent to a surface of the wafer for monitor charges on the wafer surface, U.S. Pat. No. 8,111,499 disposes a residual charge sensor along a discharging path to sense a residual charge discharging from the wafer via the discharge path, U.S. Pat. No. 7,676,730 uses an electron beam gun to inject E-beam above the top surface of the wafer and then monitor how the trajectory of the E-beam is affected by any charge buildup, and U.S. Pat. No. 7,038,223 uses the arrays of charge-sensing probes for sensing charges. Besides, just for example, the article "Proc. Frontiers in Low Temperature Plasma Diagnostics IV, Rolduc, Netherlands, March 2001, P.230" also discloses that the charging monitor only may be done after the plasma process. However, it is still a field to be improved about how to achieve wafer charge monitoring in a real-time manner with simple hardware and simple operation, even with less population and less noise.

Therefore, it is required to provide new and improved apparatus and/or method for monitoring the charges appeared on the wafer held by chuck, especially on the processed wafer.

SUMMARY OF THE INVENTION

The present invention is proposed for monitoring charges on wafer. Especially, the present invention directly detects the density of the charges appeared on the backside surface of the wafer for achieving wafer charges monitoring.

In this invention, a conductive pin, a conductive spring and a conductive line are used to electrically connect the backside surface of the wafer with a sample conductor. Hence, the backside surface of the wafer and the surface of the sample conductor should have identical charge density (except some minor variations, such as the effect of the unavoidable electric resistance), and then the wafer charge status may be properly monitor by detecting the charge density on the surface of the sample conductor. In general, the wafer is positioned on a chuck and both the conductive pin and conductive spring embedded inside the chuck are used to electrically connect the backside surface of the wafer to the conductive line. As usual, the sample conductor is a sheet conductor and a static electricity sensor is positioned close to the surface of the sheet conductor for detecting the charge density. Particularly, the sample conductor and the static electricity sensor usually are positioned outside the chamber where the wafer is placed and processed. In this way, the hardware positioned inside the chamber, especially close to the wafer, may be simplified and then the contamination risk may be reduced. Note that it is well-known skill to use at least one pin embedded in the chuck for supporting the chuck, and then the usage of the conductive pin(s) does not significantly alter the configuration of the chuck, the conductive pin and the conductive spring. Of course, according to the monitored result, how the ions are neutralized may be adjusted correspondingly, how the ions is provided may be adjusted, how the plasma is generated and maintained may be adjusted, even how the wafer is processed and/or how the wafer is de-chucked and removed may be adjusted correspondingly.

DETAILED DESCRIPTION OF THE INVENTION

Reference will now be made in details to specific embodiment of the present invention. Examples of these embodiments are illustrated in the accompanying drawings. While the invention will be described in conjunction with these specific embodiments, it will be understood that the intent is not to limit the invention to these embodiments. In fact, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without at least one of these specific details. In other instances, the well-known portions are less or not described in detail in order not to obscure the present invention.

Figure 1:
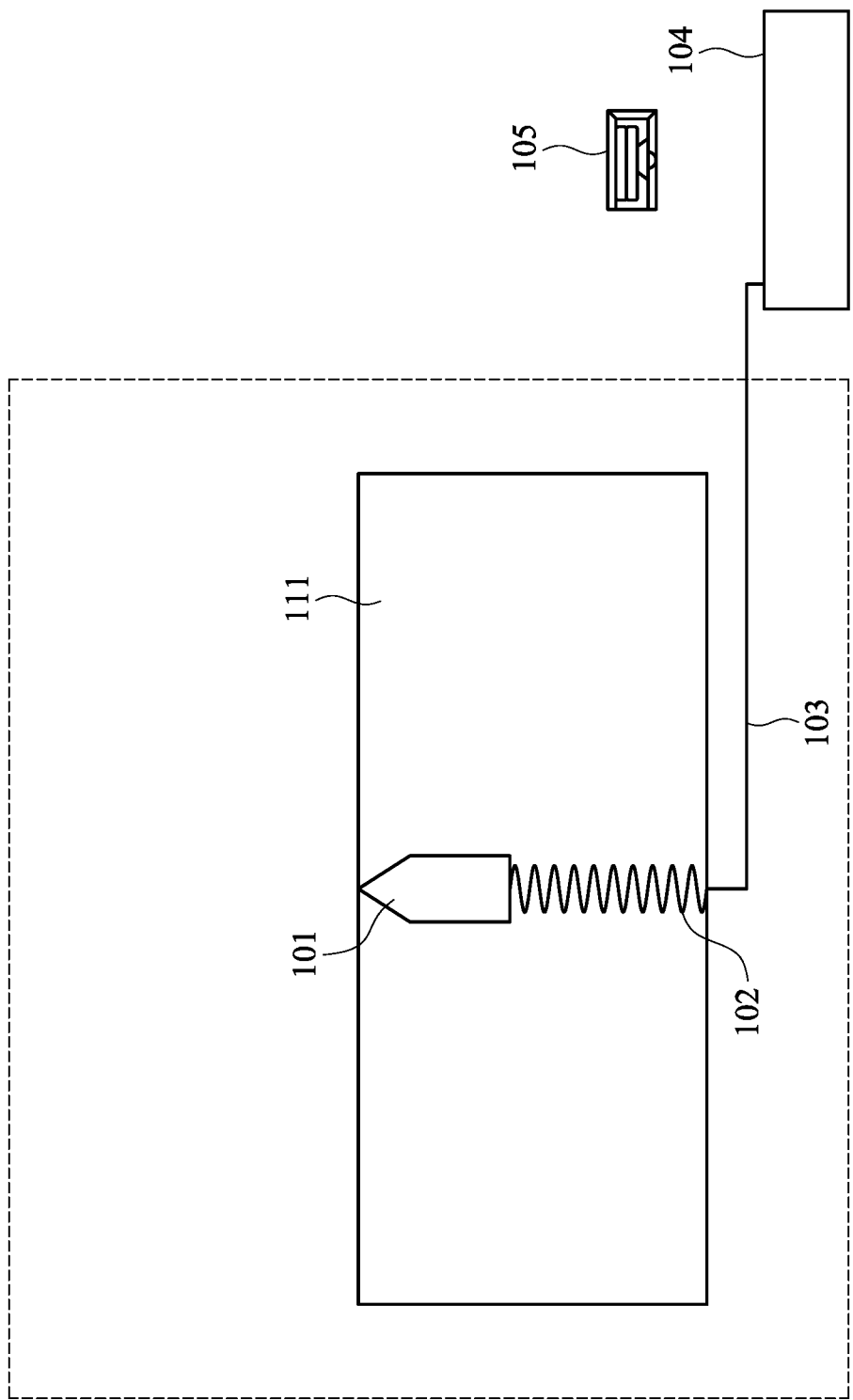
FIG. 1 is the cross-sectional illustration of an embodiment of an apparatus for wafer charge monitoring.

One exemplary embodiment of this invention is an apparatus for wafer charge monitoring. As shown in FIG. 1, the exemplary embodiment includes at least a conductive pin 101, a conductive spring 102, a conductive line 103, a sample conductor 104 and a static electricity sensor 105. Both the conductive pin 101 and the conductive spring 102 are embedded in a chuck 111 configured to hold a wafer to be processed, and the conductive pin 101 is electrically connected to and supported by the conductive spring 102 to contact and support the backside surface of the wafer in the situation that the wafer is placed and/or maintained over the chuck 111. Also, a first end of the conductive line 103 is electrically connected to the conductive spring 102 and a second end of the conductive line 103 is electrically connected to the sample conductor 104. Besides, the static electricity sensor 105 is positioned close to a surface of the sample conductor 104 and configured to detect the charges appeared on the surface of the sample conductor 104, also the sample conductor 104 is insulated from the surrounding environment.

Apparently, the proposed apparatus only detects the charges appeared on the backside surface of the wafer. Note that only the conductive pin 101 of all elements of the proposed apparatus may be connected to the wafer, but the conductive pin 101 only mechanically contacts the backside surface of the wafer. Indeed, as usual, both the sample conductor 104 and the static electricity sensor 105 are positioned away the chuck 111, so as to simplify the hardware close to the wafer to be process (or viewed as held by the chuck) and minimize the interaction with the ions and/or the plasma, even the microstructures formed in and on the frontside surface of the wafer. Particularly, it is better that both the sample conductor 104 and the static electricity sensor 105 are positioned outside the chamber where the chuck 111 is positioned inside, so as to further simplify the hardware inside the chuck and precisely monitoring wafer charges with minimized contamination risk. In the FIG. 1, the chamber is briefly presented by the dotted line to express such situation.

The advantages of this invention are significant and may be briefly described as below. Because the wafer is not made of insulator, any charge appears on the frontside (or the backside) surface of the wafer will induce a corresponding charge on the backside (or the frontside) surface of the wafer. Hence, by detecting the charges appeared on the backside surface of the wafer, any charge appears on both the frontside and the backside surface of the wafer may be properly monitored. Especially, by only detecting the charges appeared on the backside surface of the wafer, the proposed apparatus configured to monitor wafer charge may be not interact with the ions, even the plasma, to be reacted with the wafer, even the microstructures formed on the frontside surface of the wafer, and then both the risk of contamination and the measurement error may be minimized. One more advantage of this invention is that both the conductive pin 101 and the conductive spring 102 may be simply embedded in the chuck because it is well-known skill to embed one or more pins in the chuck for contacting and supporting the wafer placed and/or maintained over the chuck. Hence, the proposed apparatus may be simplified achieved, particularly because there are many well-known and commercial static electricity sensors.

Of course, due to the charges usually uniformly distribute over the surfaces of the wafer (or viewed as always over the surface of the conductor), it is usual to only use one and only one conductive pin 101 and one and only one conductive spring 102. However, some embodiments have several pairs of the conductive pins 101 and the conductive springs 102, wherein different pairs are embedded in different portions of the chuck 111. One potential benefit is that the precision of the wafer charges monitoring may be less degraded by the oxide or contaminants abnormally appeared on the backside surface of the wafer in the situation that one conductive pin 101 mechanically contacts with the oxide/contaminants but not the wafer. That is to say, the invention needs not to limit the amount of the used conductive pin 101 and the amount of the used conductive spring 102. In addition, the invention needs not to limit whether all of these pairs are connected to the same sample conductor 104 or whether different pairs are connected to different sample conductors 104, because the invention only wants to detect how many charges appeared on the backside surface of the wafer.

Figure 2A:
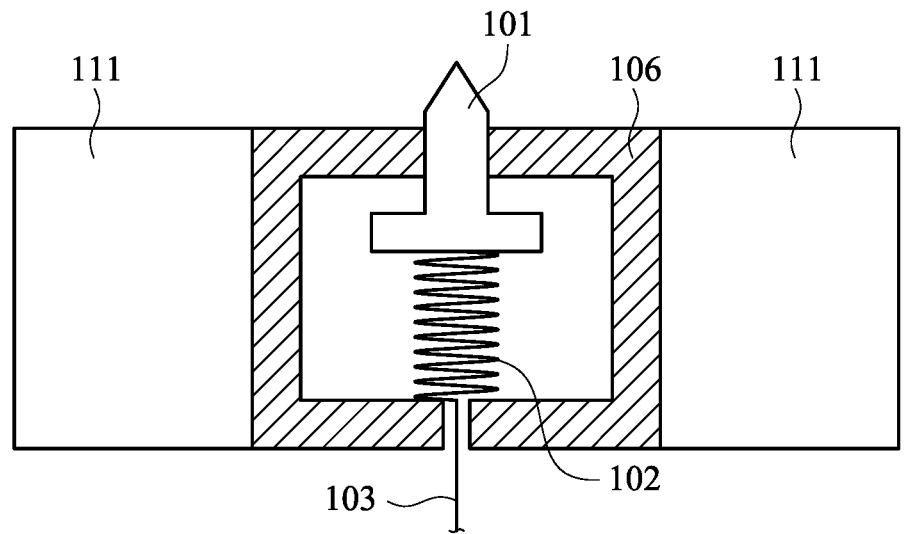
FIG. 2A and FIG. 2B are the brief illustration of two variations of the embodiment shown in FIG. 1.
Figure 2B:
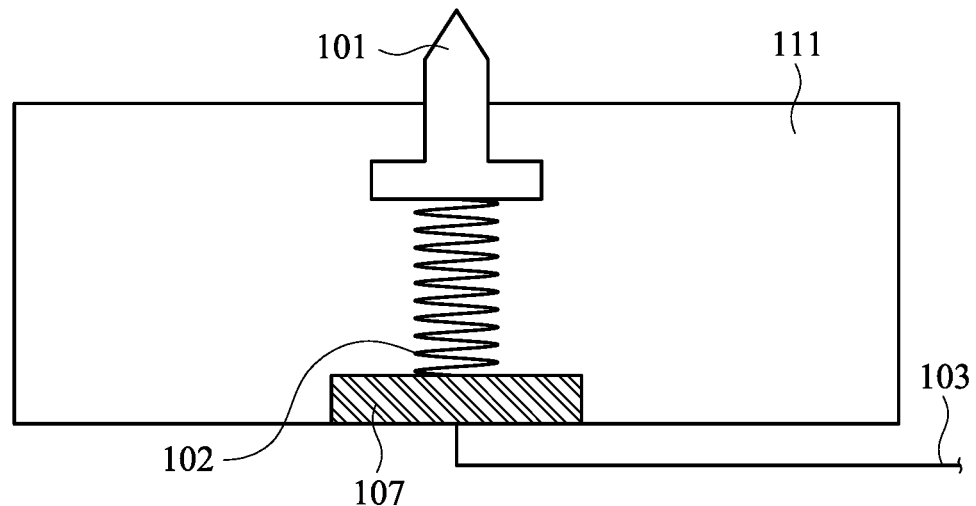

Moreover, the invention needs not to limit how the combination of the conductive pin 101 and the conductive spring 102 are embedded in the chuck 111. Because the function of the conductive pin 101 and the conductive spring 102 is guiding charges from the backside surface of the wafer through the conductive line 103 to the sample conductor 104, the only limitation is that both the conductive pin 101 and the conductive spring 102 are properly insulated from other portions of the chuck 111. For example, as shown in FIG. 2A, an insulating housing 106 may be positioned surrounding both the conductive pin 101 and the conductive spring 102 to ensure both the conductive pin 101 and the conductive spring 102 are separated from other portions of the chuck. In addition, the insulating housing 106 may be made of peek (polyaryletherketone) or other plastic, also the geometric shape of the insulating housing is not limited. For example, as shown in FIG. 2B, a conductive sheet 107 is mechanically positioned under the conductive spring 102 so as to support and fix the combination of the conductive pin 101 and the conductive spring 102, wherein the first end of conductive line 103 is solder with the conductive sheet 107.

Furthermore, any material with higher electrical conductivity may be used to form the conductive pin 101, the conductive spring 102, the conductive line 103 and the sample conductor 104. However, to further reduce any contamination or negative effect on the wafer held by the chuck 111, (or viewed as the microstructures formed on the wafer), it is optional that the conductive pin 101 is made by the material induces less contamination on the wafer held by the chuck. For example, nickel and titanium are better options than copper, iron and cobalt. Similarly, to effectively support and move the conductive pin 101, it is optional that the conductive spring 102 is made from the material has high elasticity, such as nickel and stainless steel. Besides, to effectively deliver and distribute the charges, it is optional to make the conductive line 103 and/or the sample conductor 104 by using nickel and/or copper.

Figure 3A:
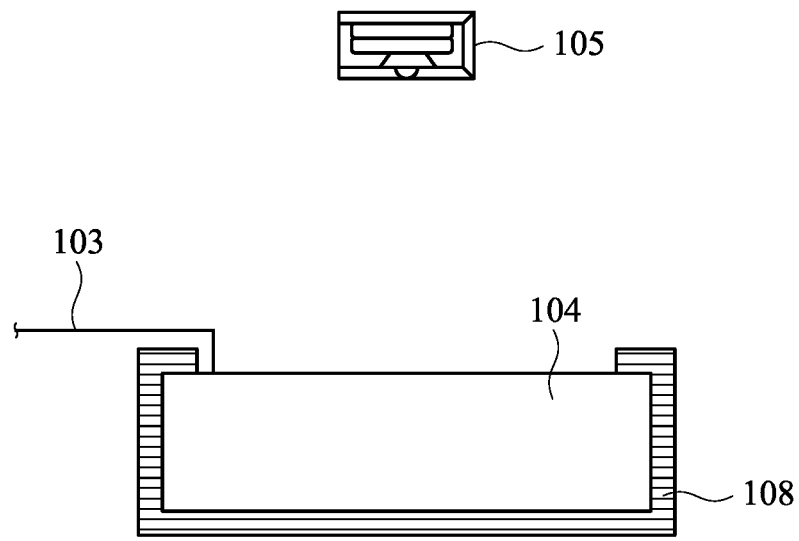
FIG. 3A, FIG. 3B and FIG. 3C are the brief illustration of three variations of the embodiment shown in FIG. 1.

As usual, as shown in FIG. 3A, the sample conductor 104 is surrounded by an insulator 108 where only the surface facing the static electricity sensor 105 is not fully covered by the insulator 108, also no other hardware is contacted with or positioned close to the surface, so that the sample conductor 104 is properly insulated from the surrounding environment. The material of the insulator 108 may be any plastic, especially, may be any plastic with higher dielectric coefficient. Besides, as usual, the thickness of the sample conductor 104 is smaller than both the length and width of the surface facing the static electricity sensor 105, because the static electricity sensor 105 only may detect the charges appears on the facing surface but not appeared on other surfaces of the sample conductor 104.

Figure 3B:
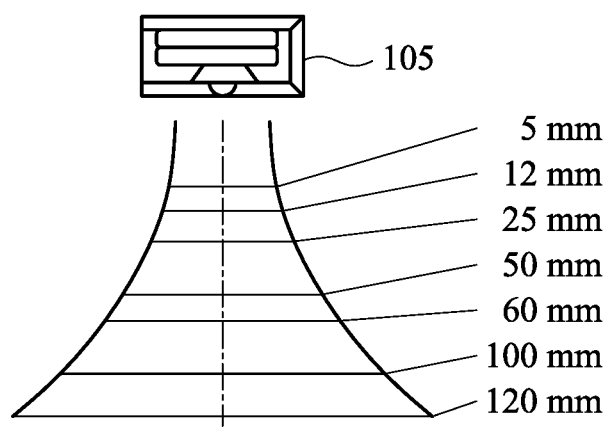
Figure 3C:
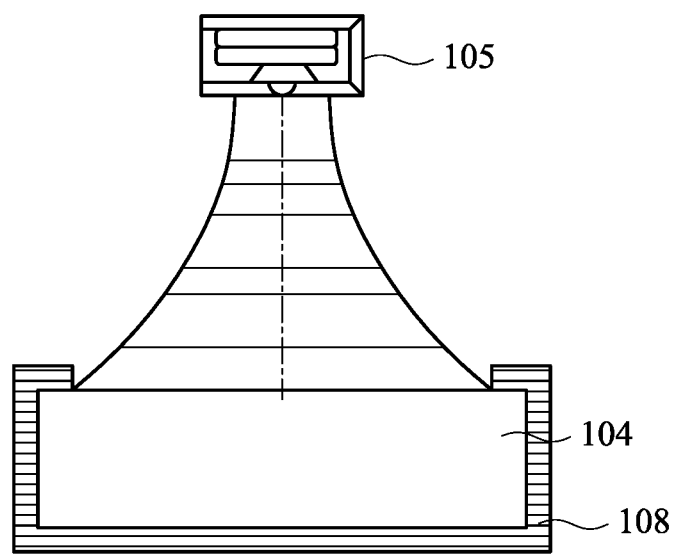

Particularly, the static electric sensor 105 may be any well-known, on-developing or to-be-appeared product having a detectable area, and the configuration of the sample conductor 104 and the static electric sensor 105 is dependent the details of the detectable area. Just for example, but not limited to, the detectable area of a current commercial static electric sensor is usually proportion to the distance between the static electric sensor 105 and the facing surface of the sample conductor 104. FIG. 3B briefly illustrates that the radius of the detectable area is non-linearly increased from 5 mm to 120 mm and in proportional to the distance from the static electric sensor 105 in the situation that the static electric sensor 105 is a commercial sensor provided by the Keyence company. As usual, to minimize the noise and improve the measurement precision, the sample conductor 104 and the static electricity sensor 105 is configured so that the detectable area of the static electricity sensor 105 is fully inside the surface of the sample conductor 104. That is to say, the distance therebetween is proportional to the area of the surface of the sample conductor 104, and the shape of the surface of the sample conductor 104 is better to fit the shape of the detectable area of the static electricity sensor 105. Of course, to fully use the sample conductor 104 and minimize unnecessary disadvantage, the sample conductor 104 and the static electricity sensor 105 is configured so that the detectable area of the static electricity sensor 105 and the exposure portions of the facing surface of the sample conductor 104 are fully overlapped with each other. FIG. 3C briefly illustrates a situation that the surface of the sample conductor 104 is fully overlap with the detectable area of the static electric sensor 105, except the portions covered by the insulator 108. In addition, on some other embodiments, several static electricity sensors 105 are used simultaneously and each static electricity sensor facing a portion of the surface of the sample conductor 104. Similarly, in such situation, one option is that the sample conductors 104 and these static electricity sensor 105 are configured so that the detectable areas of these static electricity sensors 105 are fully inside the surface of the sample conductor 104, and another option is that the sample conductor 104 and these static electricity sensors 105 are configured so that the detectable areas of these static electricity sensors 105 and the surface of the sample conductor 104 are fully overlapped with each other.

Significantly, the invention may be used to achieve wafer charge monitoring in a real-time manner, because the charges appeared on the backside surface of the wafer may be immediately guided through these conductive elements to the surface of the sample conductor and then may be continuously detected by the static charge sensor. Moreover, the invention may be used to monitor wafer charge at a special moment and/or during a period (i.e., monitor how the charges are accumulated on the wafer) by using the static electricity sensor continuously and/or temperately, because these conductive elements and the sample conductor may be continuously connected. That is to say, the invention may be used to monitor wafer charge during the period of processing the wafer and/or outside such period. Further, the invention may be used to achieve wafer charge monitoring with less contamination and higher precision, because all of the conductive elements, the sample conductor and the static electricity sensor may be not interact with both the wafer and the ions/plasma to be reacted with the wafer, especially in the case that both the sample conductor and the static electricity sensor are positioned away the chuck, even in the case that both the sample conductor and the static electricity sensor are positioned outside the chamber where the chuck is located inside. Note that the proposed apparatus also almost not interact with the chuck because the conductive pin and the conductive spring are just embedded in the chuck, even is insulated from other portions of the chuck.

Figure 4A:
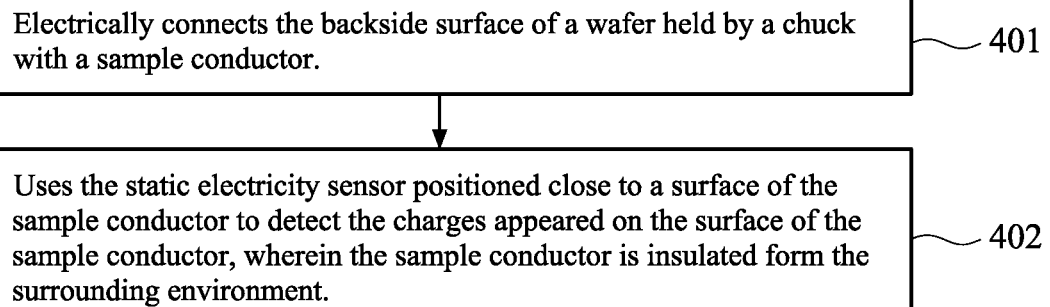
FIG. 4A, FIG. 4B and FIG. 4C are the basic flow-charts of three embodiments of a method for wafer charge monitoring.
Figure 4B:
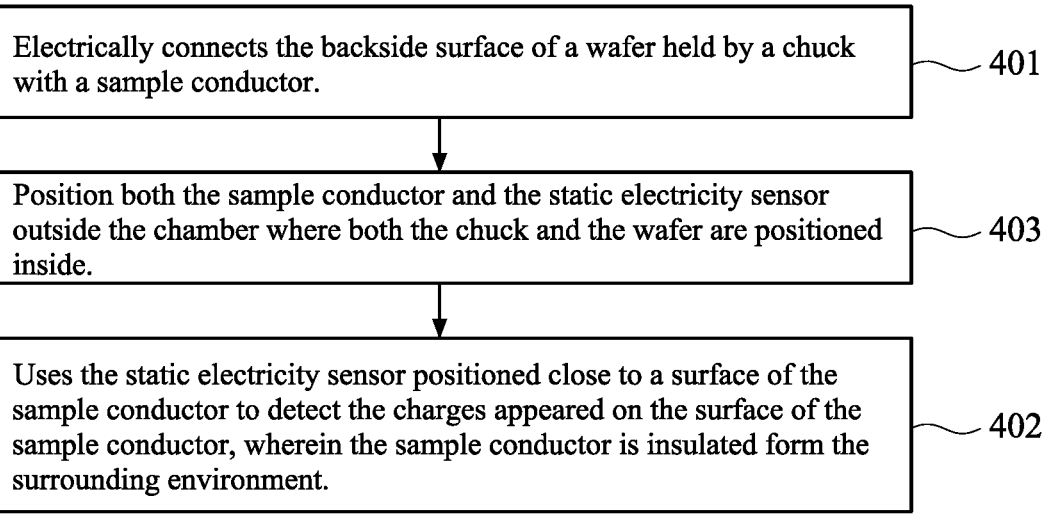
Figure 4C:
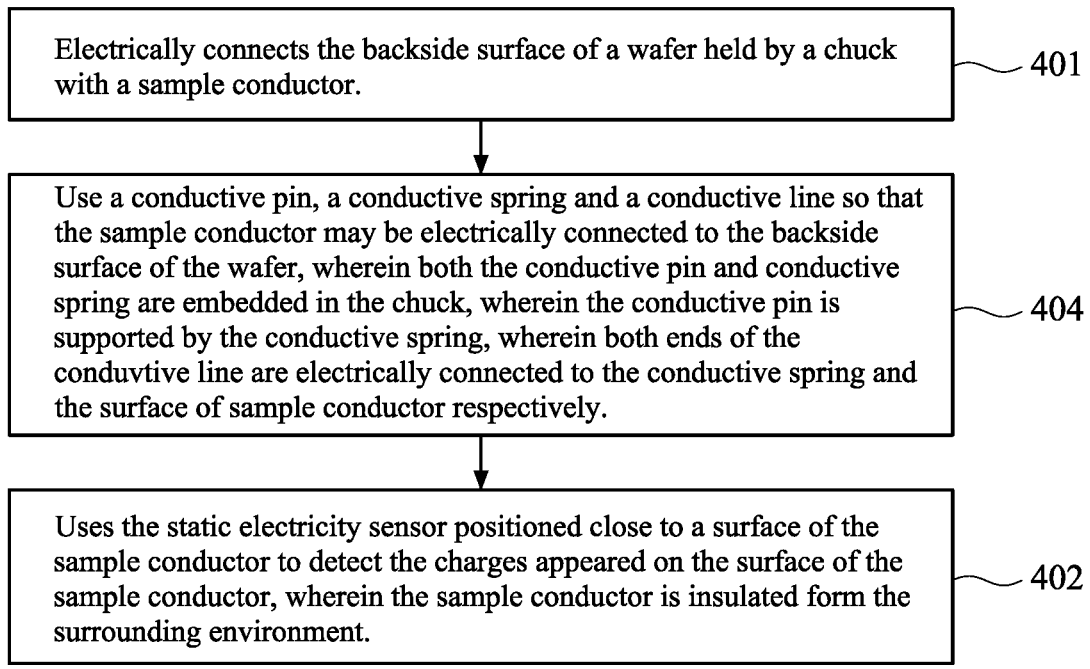

One exemplary embodiment of this invention is a method for wafer charge monitoring. As shown in FIG. 4A, the exemplary embodiment includes the following essential steps. First, as shown in block 401, electrically connects the backside surface of a wafer held by a chuck with a sample conductor. Next, as shown in block 402, uses the static electricity sensor positioned close to a surface of the sample conductor to detect the charges appeared on the surface of the sample conductor, wherein the sample conductor is insulated from the surrounding environment. Moreover, to further simplify the machine inside the chamber and reduce the risk of contamination, as shown in block 403 of FIG. 4B, an optional step is to position both the sample conductor and the static electricity sensor outside the chamber where both the chuck and the wafer are positioned inside. Further, to use the apparatus described as above, as shown in block 404 of FIG. 4C, another optional step is to use a conductive pin, a conductive spring and a conductive line so that the sample conductor may be electrically connected to the backside surface of the wafer, wherein both the conductive pin and conductive spring are embedded in the chuck, wherein the conductive pin is supported by the conductive spring, wherein both ends of the conductive line are electrically connected to the conductive spring and the surface of sample conductor respectively.

Furthermore, the charge messages detected by the static electricity sensor may be used to perform some different applications. Note that one main source of the charges appeared on the wafer is that the ion beam is not properly neutralized before being implanted into the wafer, it is optional to adjust the operation of a plasma shower for neutralizing an ion beam to be implanted into the wafer according to the charge messages detected by the static electricity sensor. Of course, whether to adjust the flow rate of the gas inputted into the plasma shower or to adjust the current flowing through the filament inside the plasma shower is not limited, even other portions of the plasma shower may be adjusted correspondingly. Moreover, because the excess charges on the wafer will change the interaction between the wafer and the chuck, it is optional to adjust the operation of the de-chucking process to properly remove the wafer away the chuck according to the charge messages detected by the static electricity sensor. For example, the grounding process may be repeated to eliminate the recess charges, the force applied by the pins to lift the wafer away the chuck may be increased, and other portions of the de-chucking process may be adjusted. Besides, because the charges appeared on the wafer may affect how the ion beam is delivered into the wafer, it is optional to adjust the generation and/or the modulation of the ions beam to be delivered into the wafer, and also is optional to adjust the movement of the wafer held by the chuck according to the charge messages detected by the static electricity sensor. Similarly, for the plasma process that either the plasma reacts with the wafer or the ions are extracted away and then delivered to the wafer, not only the electric voltage applied to the chuck but also the generation and/or maintenance of the plasma may be adjusted according to the charge messages detected by the static electricity sensor. Hence, just for example, the charges left on the wafer after the plasma process may be minimized. In addition, the potential kinds of the plasma process includes but not limited to the following: CVD, PECVD and etching.

Figure 5:
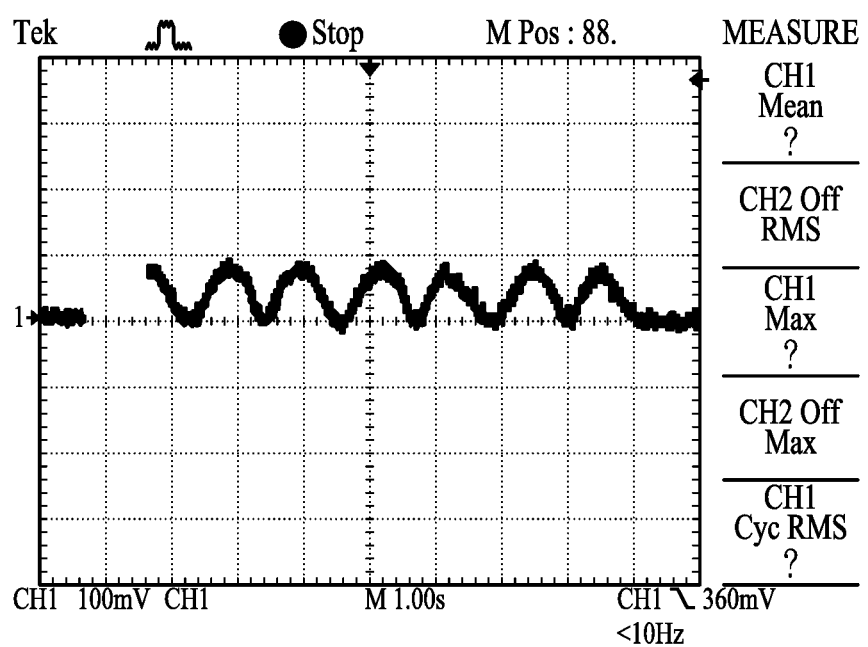
FIG. 5 is a figure briefly showing the benefit of one embodiment.

FIG. 5 is a figure briefly showing the benefit of one embodiment which flexibly adjust both the energy of the ion beam to be introduced into a wafer and the electric resistance between the chuck holding the wafer and the ground in the situation that an one-dimensional spot ion beam is used to scan through the wafer repeatedly. In FIG. 5, the horizontal axis is the process time axis and the vertical axis is the voltage axis (the commercial static electricity sensor detect the charges and outputs voltage signals correspondingly). Each time the spot beam is scanned through the wafer, the voltage (proportional to the charges amount) is gradually increased as the spot beam is moved from the wafer edge to the wafer center and gradually decreased as the spot beam is moved from the wafer center to the wafer edge. Obviously, by properly adjusting, the amount of the charges appeared on the wafer is properly monitored, where the essentially identical measurement results are appeared in series.

Variations of the methods, the devices, the systems and the applications as described above may be realized by one skilled in the art. Although the methods, the devices, the systems, and the applications have been described relative to specific embodiments thereof, the invention is not so limited. Many variations in the embodiments described and/or illustrated may be made by those skilled in the art. Accordingly, it will be understood that the present invention is not to be limited to the embodiments disclosed herein, can include practices other than specifically described, and is to be interpreted as broadly as allowed under the law.

What is claimed is:

1. A method for monitoring electrical charges on a surface of a wafer, comprising:
   at a wafer charge monitoring system including a chuck, a sample conductor that is insulated from a surrounding environment, and a static electricity sensor that is positioned proximate to a surface of the sample conductor:
   positioning the wafer on the chuck, wherein positioning the wafer on the chuck electrically connects a backside surface of the wafer to the sample conductor;
   detecting, using the static electricity sensor, an electrical charge on a surface of the sample conductor; and
   determining, using the static electricity sensor, one or more voltage signals based on the detected electrical charge.

2. The method of claim 1, wherein both the sample conductor and the static electricity sensor are positioned outside a processing chamber, and
   wherein both the chuck and the wafer are positioned inside the processing chamber.

3. The method of claim 1, wherein the chuck comprises a conductive pin and a conductive spring that supports the conductive pin,
   wherein the conductive spring is electrically connected to a first end of a conductive line, and
   wherein a surface of the sample conductor is electrically connected to a second end of the conductive line.

4. The method of claim 3, wherein positioning the wafer on the chuck causes the backside surface of the wafer to contact the conductive pin, and
   wherein the backside surface of the wafer is electrically connected to the sample conductor after the backside surface of the wafer contacts the conductive pin.

5. The method of claim 3, wherein the conductive pin and the conductive spring are embedded within the chuck,
   wherein the conductive pin and the conductive spring are surrounded by an insulating housing, and
   wherein the insulating housing prevents the conductive pin and the conductive spring from touching a surface of the chuck.

6. The method of claim 3, wherein the conductive pin is made of nickel or titanium.

7. The method of claim 3, wherein the conductive spring is made of nickel or stainless steel.

8. The method of claim 1, wherein the wafer charge monitoring system further includes a conductive sheet,
   wherein the chuck comprises a conductive pin and a conductive spring that supports the conductive pin,
   wherein the conductive sheet is positioned beneath the conductive spring and is electrically connected to the conductive spring,
   wherein a first end of a conductive line is electrically connected to the conductive sheet, and
   wherein a surface of the sample conductor is electrically connected to a second end of the conductive line.

9. The method of claim 1, wherein the chuck comprises a plurality of conductive pins and a plurality of conductive springs,
   wherein each conductive spring of the plurality of conductive springs supports a conductive pin of the plurality of conductive pins,
   wherein each conductive spring is electrically connected to a first end of a conductive line of a plurality of conductive lines, and
   wherein a surface of the sample conductor is electrically connected to a second end of each conductive line of the plurality of conductive lines.

10. The method of claim 9, wherein the wafer charge monitoring system further includes a second sample conductor, and
    wherein at least one conductive line of the plurality of conductive lines is electrically connected to the second sample conductor instead of the sample conductor.

11. The method of claim 10, wherein the wafer charge monitoring system further includes a second static electricity sensor that faces the second sample conductor, further comprising:
    detecting, using the second static electricity sensor, an electrical charge on a surface of the second sample conductor; and
    determining, using the second static electricity sensor, one or more voltage signals based on the detected electrical charge.

12. The method of claim 1, wherein an insulating material surrounds the sample conductor except for a portion of a surface of the sample conductor that faces the static electricity sensor.

13. The method of claim 1, wherein the wafer charge monitoring system further includes a plurality of static electricity sensors, and
    wherein each static electricity sensor of the plurality of static electricity sensors faces a portion of the surface of the sample conductor.

14. The method of claim 1, further comprising at least one of the following:
- adjusting an operation of a plasma shower for neutralizing an ion beam that will implant ions into the wafer based on the one or more voltage signals determined by the static electricity sensor;
- adjusting an operation of a de-chucking process for properly removing the wafer from the chuck based on the one or more voltage signals determined by the static electricity sensor;
- adjusting a generation and/or a modulation of the ion beam that will implant ions into the wafer based on the one or more voltage signals determined by the static electricity sensor;
- adjusting a generation and/or a maintenance of plasma for the plasma shower based on the one or more voltage signals determined by the static electricity sensor, wherein the plasma reacts with the wafer or with ions that are extracted away from the plasma and then delivered to the wafer;
- adjusting an electric voltage applied to the chuck based on the one or more voltage signals determined by the static electricity sensor; and
- adjusting a movement of the chuck holding the wafer based on the one or more voltage signals determined by the static electricity sensor.

* * * * *